# (12) United States Patent
Fletcher et al.

(10) Patent No.: US 8,390,324 B2
(45) Date of Patent: Mar. 5, 2013

(54) UNIVERSAL FUNCTIONALITY MODULE

(75) Inventors: Mitch Fletcher, Glendale, AZ (US);
Thom Kreider, Peoria, AZ (US);
Nicholas Wilt, Glendale, AZ (US)

(73) Assignee: Honeywell International Inc.,
Morristown, NJ (US)

( * ) Notice: Subject to any disclaimer, the term of this patent is extended or adjusted under 35 U.S.C. 154(b) by 0 days.

(21) Appl. No.: 12/886,276

(22) Filed: Sep. 20, 2010

(65) Prior Publication Data

US 2012/0068733 A1   Mar. 22, 2012

(51) Int. Cl.
*H03K 19/177* (2006.01)
(52) U.S. Cl. ............................................ 326/39; 326/41
(58) Field of Classification Search ............... 326/38–47
See application file for complete search history.

(56) References Cited

U.S. PATENT DOCUMENTS

| | | | |
|---|---|---|---|
| 3,543,048 A | 11/1970 | Klaschka | |
| 3,818,412 A | 6/1974 | Deardurff | |
| 3,818,725 A | 6/1974 | Sakuragawa et al. | |
| 3,849,632 A | 11/1974 | Eckert, Jr. et al. | |
| 4,088,963 A | 5/1978 | Machida et al. | |
| 4,370,706 A | 1/1983 | Doniger et al. | |
| 4,486,826 A | 12/1984 | Wolff et al. | |
| 4,903,270 A | 2/1990 | Johnson et al. | |
| 4,967,347 A | 10/1990 | Smith et al. | |
| 4,991,174 A | 2/1991 | Mori et al. | |
| 5,136,704 A | 8/1992 | Danielsen et al. | |
| 5,276,690 A | 1/1994 | Lee et al. | |
| 5,339,408 A | 8/1994 | Bruckert et al. | |
| 5,349,691 A * | 9/1994 | Harrison et al. ................. 326/38 |
| 5,373,508 A | 12/1994 | Guliani | |
| 5,386,518 A | 1/1995 | Reagle et al. | |
| 5,486,777 A * | 1/1996 | Nguyen ........................... 326/68 |
| 5,513,527 A | 5/1996 | Griffiths | |
| 5,563,526 A * | 10/1996 | Hastings et al. ................ 326/37 |
| 5,581,739 A | 12/1996 | FitzPatrick | |
| 5,586,124 A | 12/1996 | Nicolaidis | |
| 5,602,828 A | 2/1997 | Engdahl et al. | |
| 5,758,058 A | 5/1998 | Milburn | |
| 5,794,055 A | 8/1998 | Langer et al. | |
| 5,805,797 A | 9/1998 | Sato et al. | |
| 5,937,202 A | 8/1999 | Crosetto | |
| 6,023,774 A | 2/2000 | Minagawa | |
| 6,085,350 A | 7/2000 | Emmert et al. | |
| 6,150,836 A | 11/2000 | Abbott | |
| 6,255,972 B1 | 7/2001 | Gross et al. | |
| 6,260,087 B1 * | 7/2001 | Chang ........................... 710/100 |
| 6,289,024 B1 | 9/2001 | Toillon | |

(Continued)

OTHER PUBLICATIONS

USPTO Office Action for U.S. Appl. No. 12/750,341; Notification date Apr. 29, 2011.

(Continued)

*Primary Examiner* — Crystal L Hammond
(74) *Attorney, Agent, or Firm* — Ingrassia Fisher & Lorenz, P.C.

(57) ABSTRACT

Methods and apparatus are provided for a Universal functionality Module (UFM). The apparatus comprises a programmable logic device (PLD) configured to be reprogrammed in real time and a means for universally interfacing the PLD with any effectuator device. The UFM loads a startup personality bit stream from a boot memory, which allows it to read a pin configuration associated with a effectuator device. The UFM receives a function personality associated with the pin configuration, writes the function personality to programmable logic device, and initiates the function personality.

13 Claims, 6 Drawing Sheets

U.S. PATENT DOCUMENTS

| | | | |
|---|---|---|---|
| 6,311,149 B1 | 10/2001 | Ryan et al. | |
| 6,448,914 B1 | 9/2002 | Younis et al. | |
| 6,604,177 B1 | 8/2003 | Kondo et al. | |
| 6,721,581 B1 | 4/2004 | Subramanian | |
| 6,731,232 B1 | 5/2004 | Kearney | |
| 6,804,292 B2 | 10/2004 | Liu et al. | |
| 6,825,689 B1 | 11/2004 | Snyder | |
| 6,864,822 B2 | 3/2005 | Gulati et al. | |
| 6,948,091 B2 | 9/2005 | Bartels et al. | |
| 7,049,989 B2 | 5/2006 | Runals et al. | |
| 7,072,779 B2 | 7/2006 | Hancock et al. | |
| 7,190,748 B2 | 3/2007 | Kim et al. | |
| 7,215,197 B2 | 5/2007 | Regier | |
| 7,301,362 B2 | 11/2007 | Jang et al. | |
| 7,369,078 B2 | 5/2008 | Nickel et al. | |
| 7,405,682 B2 | 7/2008 | Ebner et al. | |
| 7,408,495 B2 | 8/2008 | Stein et al. | |
| 7,411,538 B1 | 8/2008 | Piasecki | |
| 7,505,400 B2 | 3/2009 | Bibby et al. | |
| 7,516,303 B2 | 4/2009 | Kundu et al. | |
| 7,548,590 B2 | 6/2009 | Koller et al. | |
| 7,584,345 B2 | 9/2009 | Doering et al. | |
| 7,589,649 B1 | 9/2009 | Aga et al. | |
| 7,602,274 B2 | 10/2009 | Lee et al. | |
| 7,609,100 B2 | 10/2009 | Nagata | |
| 7,673,087 B1 | 3/2010 | Ansari et al. | |
| 7,715,433 B2 | 5/2010 | Boren | |
| 7,791,370 B1* | 9/2010 | Hoang et al. | 326/38 |
| 7,850,127 B2 | 12/2010 | Lemonovich et al. | |
| 2006/0010438 A1 | 1/2006 | Brady, Jr. et al. | |
| 2006/0038710 A1 | 2/2006 | Staszewski et al. | |
| 2007/0063197 A1 | 3/2007 | Burkatovsky | |
| 2007/0126584 A1 | 6/2007 | Hyde et al. | |
| 2008/0079148 A1* | 4/2008 | Leung et al. | 257/734 |
| 2008/0297388 A1 | 12/2008 | Thiagarajan et al. | |
| 2009/0140809 A1 | 6/2009 | Chi | |
| 2009/0175381 A1 | 7/2009 | Bougard | |
| 2010/0005366 A1* | 1/2010 | Dell et al. | 714/758 |

OTHER PUBLICATIONS

Notice of Allowance dated Aug. 19, 2011, U.S. Appl. No. 12/750,341.
Response to Office Action dated Jul. 26, 2011, U.S. Appl. No. 12/750,341.
USPTO Office Action dated Mar. 6, 2012 for U.S. Appl. No. 12/768,448.
USPTO Final Office Action for U.S. Appl. No. 12/768,448 dated Sep. 13, 2012.
Microsoft Computer Dictionary Fourth Edition; The Ultimate Computer Reference, 1999 by Microsoft Corporation.
Electronic Engineering Dictionary; Retrieved on Jun. 25, 2012; http://www.interfacebus.com/Glossary-of-terms_P6.html.
PCMAG.com encyclopedia; Retrieved on Jun. 25, 2012; http://www.pcmag.com/encyclopediaterm/0,1237,t=PLD&i=49377,00.asp.
USPTO Office Action for U.S. Appl. No. 12/713,712; Notification date Jul. 25, 2012.
USPTO Notice of Allowance for U.S. Appl. No. 12/713,712 dated Oct. 11, 2012.

\* cited by examiner

UNIVERSAL FUNCTIONALITY MODULE

TECHNICAL FIELD

The present invention generally relates to effectuator input/output devices, and more particularly relates to a universal functionality module that may operate any effectuator device.

BACKGROUND

It is estimated that it currently costs $1 million per kilogram to put a payload on the lunar surface. This restriction is being addressed by miniaturizing components, maximizing functionality of components and eliminating unnecessary components to minimize weight and space requirements. Not only does a component itself take up space and add weight, but most components are accompanied into space with a spare in the unlikely event that the component malfunctions. However, the cost, size, weight and capability of spacecraft components are always issues of concern. Frequently, trade offs must be made between cost, weight and size, and capability.

Spacecraft command and control electronics are indispensable. Their complexity increases geometrically as demand for system capability grows. Command and control electronics monitor the various components of the space craft using a plurality of analog and digital sensors/transducers, make a decision based in part on the sensor input and then cause the space craft to do something via a plurality of actuators that may be analog or digital devices. Combined, transducers, sensors, actuators and peripherals are referred to herein as effectuators.

Conventionally, effectuators not only comprise the functional devices themselves, but also include supporting controllers and input/output interface electronics. These supporting electronics permit the effectuator to communicate with a higher level computer and to translate any commands issued by the computer to analog or digital commands that are executable by the effectuator. Because effectuators are manufactured by number of disparate vendors, some are custom designed, and others are acquired off the shelf, each effectuator commonly has its own unique control circuitry that is usually incompatible with other effectuators. Hence, a significant amount of space and payload capacity is consumed by spare electronics for these disparate devices.

Accordingly, it is desirable to minimize the cumulative size and weight of spare electronics to reduce launch costs and save valuable cargo space. Further, it is desirable to simplify repairs. Furthermore, other desirable features and characteristics of the present invention will become apparent from the subsequent detailed description of the invention and the appended claims, taken in conjunction with the accompanying drawings and this background of the invention.

Although discussed herein in the context of a spacecraft or satellite, the subject matter disclosed herein may be applied to other types of vehicles, effectuators or other electronic systems. Any reference to spacecraft applications is merely exemplary and is not intended to limit the scope of the following disclosure in any way.

BRIEF SUMMARY

A universal functionality device is provided. The device comprises a programmable logic device (PLD), a plurality of generic electrical connectors and a universal input/output (I/O) interface device in communication with the PLD and the plurality of electrical connectors.

A system configured to operate any effectuator device is provided. The system comprises a programmable logic device (PLD) configured to be reprogrammed in real time; and a means for universally interfacing the PLD with any effectuator device.

A method is provided for initiating a universal functionality module. The method comprises loading a startup personality bit stream from a boot memory and reading a pin configuration associated with an effectuator device. The method further comprises receiving a function personality associated with the pin configuration, writing the function personality to programmable logic device, and initiating the function personality.

BRIEF DESCRIPTION OF THE DRAWINGS

The present invention will hereinafter be described in conjunction with the following drawing figures, wherein like numerals denote like elements.

DETAILED DESCRIPTION

Figure 1:
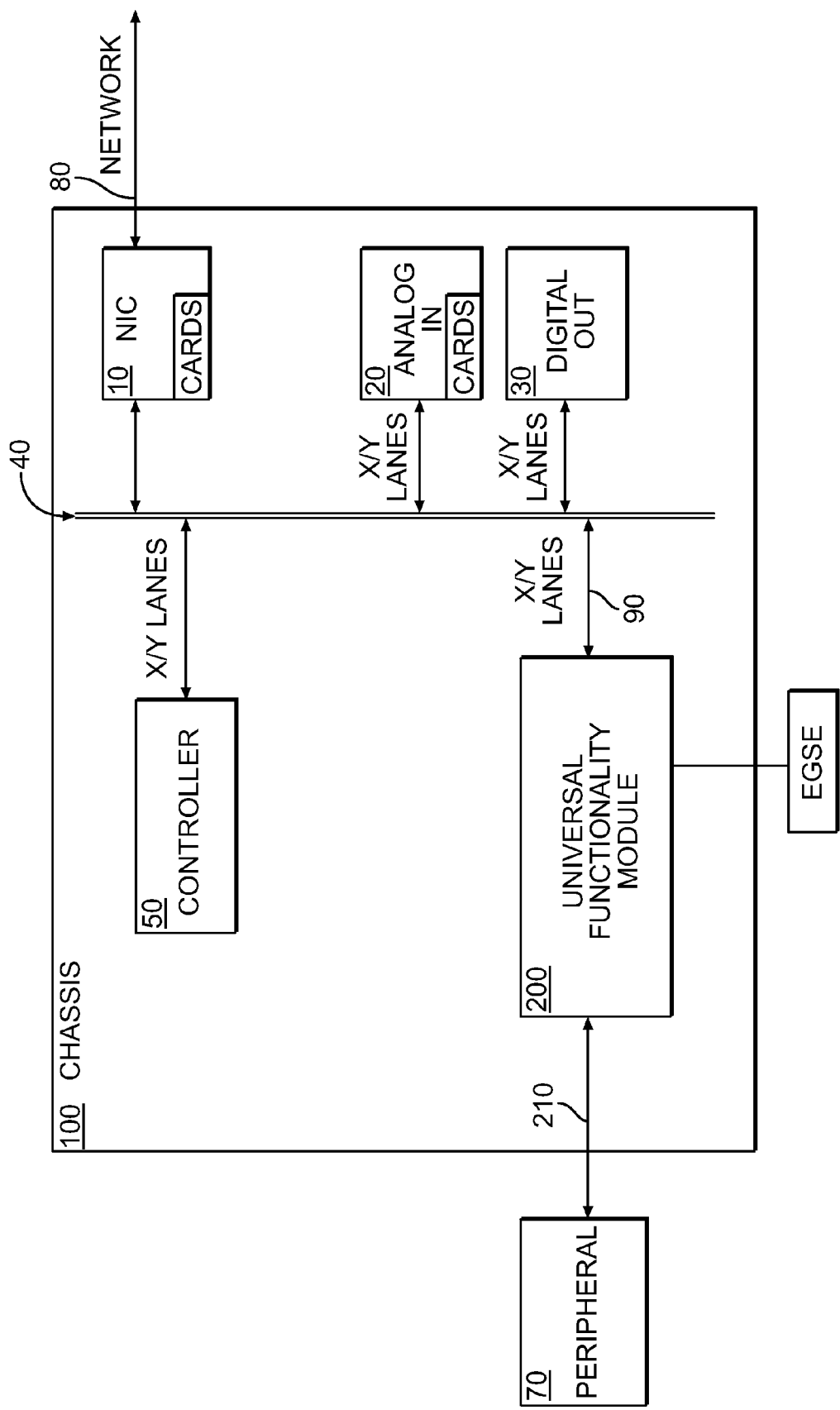
FIG. 1 is a functional block diagram of an equipment chassis including a Universal Functionality Module.

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Various illustrative logical blocks, modules, circuits, and algorithm steps described in connection with the embodiments disclosed herein may be implemented as electronic hardware, computer software, or combinations of both. Some of the following embodiments and implementations are described in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations The various illustrative logical blocks, modules, and circuits described in connection with the embodiments disclosed herein may be implemented or performed with a general purpose processor, a digital signal processor (DSP), an application specific integrated circuit (ASIC) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The word "exemplary" is used exclusively herein to mean "serving as an example, instance, or illustration." Any embodiment described herein as "exemplary" is not necessarily to be construed as preferred or advantageous over other embodiments.

By combining input and output functionality into a single re-configurable I/O circuit, a single pair of terminals may operate alternately as either input terminals or as output terminals for a variety of electronic signals. Therefore, greater pin utilization may be achieved that accommodates a wider variety of functions for effectuator 70. A non-limiting example of the reconfigurable digital I/O interface 240 may be found in the co-owned, co-pending application Ser. No. 12/768,448, which is herein incorporated by reference in its entirety. The reconfigurable I/O interface 240 is defined herein as a universal input/output (I/O) interface device either alone or as may be integrated or operationally combined with the reconfigurable I/O analog interface 230.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

FIG. 1 is a functional block diagram of an exemplary equipment chassis 100 that may communicate with a higher level computer system (not shown) via network bus 80 and a network interface controller 10. The equipment chassis 100 may include an internal bus or backplane 40 that connects one or more universal functionality modules 200 to the network 80. Each universal functionality module 200 may further connect an effectuator device 70 to the backplane 40 via a cable 210 and a communications bus 90.

The chassis controller is 50 is a computing device that controls communications between the various universal functionality modules 200, the network interface controller 10, and various other components such as analog input card 20 and digital output card 30. The various chassis components may communicate via a backplane 40. The chassis controller 50 may query the universal functionality module(s) 200, receive data from the universal functionality module(s) and otherwise communicate therewith.

The communications bus 90 may be any suitable communications bus known in the art. As a non-limiting example, the communications bus may be a high integrity communications bus such as a Spacewire bus. The communications bus 90 may include dual independent lanes X and Y, each with a primary processor and a checking processor (i.e. a backup processor). Other examples of a communications bus 90 or bus protocols are Firewire, Ethernet, Canbus, PCI, PCI Express and the like.

Figure 2:
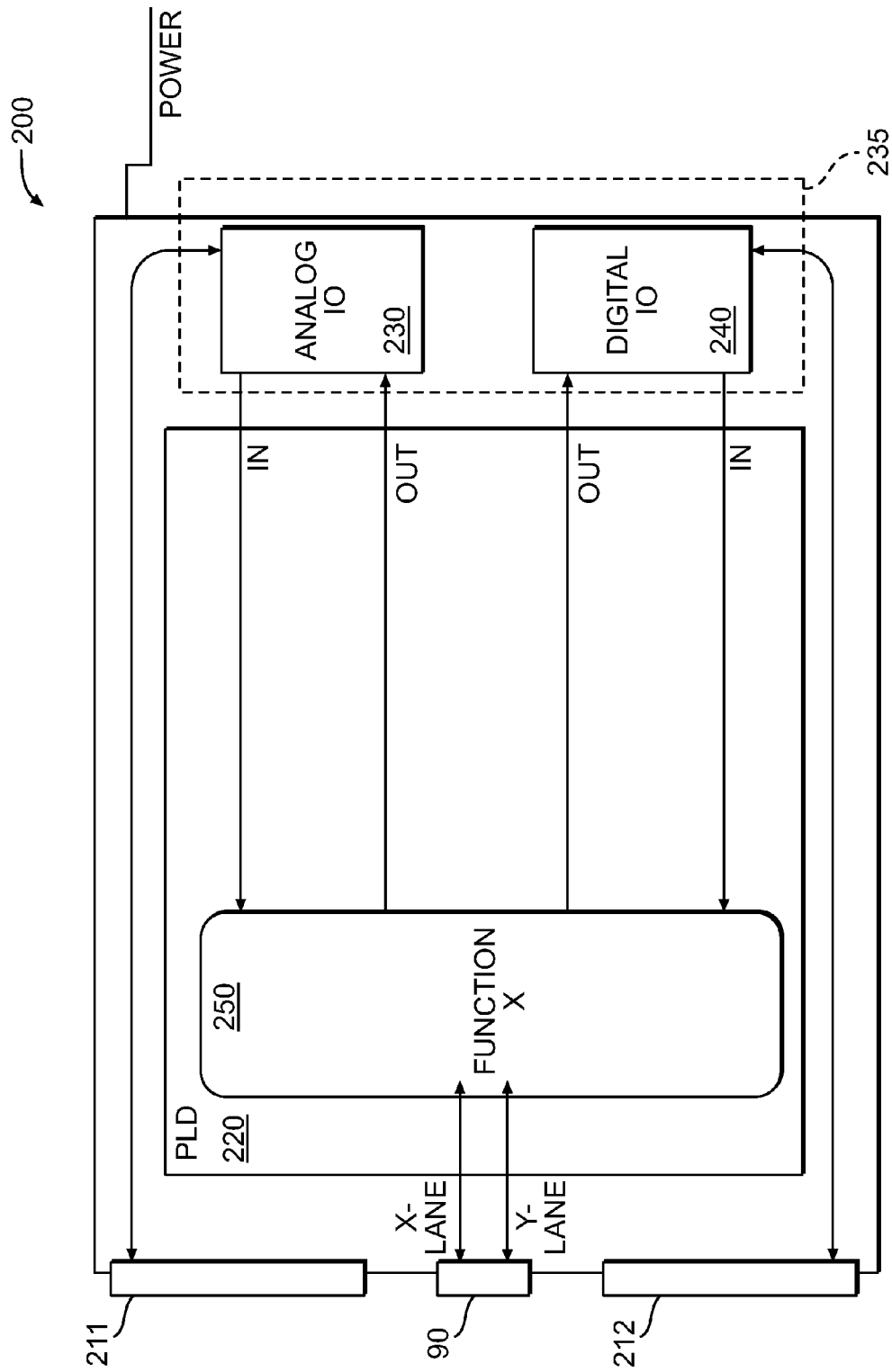
FIG. 2 is a functional block diagram of an exemplary embodiment of a Universal Functionality Module.

FIG. 2 is a functional block diagram of an exemplary embodiment of a universal functionality module 200. The universal functionality module 200 may be constructed in the form of an electronic circuit card. However, in equivalent embodiments the universal functionality module 200 may be constructed using other form factors.

The universal functionality module 200 may comprise a programmable logic device (PLD) 220, a universal I/O port 235 and one or more sets of generic electric connectors (211, 212). The universal functionality module 200 may also include one or more memory devices (e.g. see, FIG. 4).

A PLD 220 is an electronic component used to build reconfigurable digital circuits. Unlike a logic gate, which has a fixed function, a PLD 220 has an undefined personality or function 250 at the time of manufacture. Before the PLD 220 can be used in a circuit it must be programmed. A functional personality is a set of software instructions that when loaded into the PLD 220 cause the PLD 220 to become the controller for a particular effectuator 70.

However, the PLD 220 may be reprogrammed repeatedly and in real time. A PLD 220 may be recognized in the art as a combination of a logic device and a memory device that is used to store the instructions that were loaded into to the PLD during programming. Most of the methods for storing data in an integrated circuit have been adapted for use in PLDs. Non-limiting examples of memory devices include silicon antifuses, static random access memory (SRAM), erasable programmable read only memory (EPROM), electronically erasable programmable read-only memory (EEPROM), flash memory and the like.

In a preferred exemplary embodiment the PLD 220 is an SRAM PLD. An SRAM is a volatile type of memory, meaning that its contents are lost each time the power is switched off. SRAM-based PLDs therefore have to be programmed every time the PLD 220 is switched on. This programming is usually done automatically by another part of the circuit such as a flash memory, which is non-volatile, retaining its contents even when the power is switched off. The PLD 220 can be erased and reprogrammed as required in real time.

An exemplary, non-limiting SRAM based PLD 220 is a field programmable gate array (FPGA). An FPGA is an integrated circuit designed to be configured during operation by a programmer or by another computing device. FPGAs can be used to implement any logical function. FPGAs contain programmable logic components called "logic blocks" and a hierarchy of reconfigurable interconnects that allow the blocks to be interconnected. Logic blocks can be configured to perform complex combinational functions, or may merely be simple logic gates.

In addition to digital functions, some FPGAs may have analog features. For example, a common analog feature is a programmable slew rate and drive strength that may be placed on an analog output connector that establishes set slew rates on lightly loaded connectors that would otherwise ring unacceptably, and establishes stronger, faster rates on heavily loaded connectors on high-speed channels that would otherwise run too slow.

Conventional FPGAs have dedicated input connectors (e.g. input pins), dedicated output connectors (e.g. output pins), dedicated analog connectors and/or dedicated digital connectors, which limits their range of potential functions. FPGAs do not feature generic input/output connectors that may alternately become any of input connectors, output connectors, digital inputs, digital outputs or any combination thereof.

In various embodiments contemplated herein, however, the universal functionality module 200 may communicate via any sets or subset of the generic input/output pins 211/212 using the universal I/O port 235. The universal I/O port 235 may comprise a reconfigurable analog I/O interface 230 and/or a reconfigurable digital I/O interface 240. Alternatively, a universal I/O port 235 may comprise a reconfigurable analog I/O interface 230 and a reconfigurable digital I/O interface 240 that are physically or electrically combined into a single Universal I/O port 235.

The reconfigurable I/O analog interface 230 provides for an input and output functionality that allows multiple uses of various elements of the I/O interface circuitry in various modes of operation. By combining input and output functionality into a re-configurable I/O circuit, a single connector or a pair of connectors may operate alternately as either as input terminals or as output terminals for a variety of electronic signals. Thus, greater pin utilization may be achieved using generic pins 211/212, thereby accommodating a wider variety of effectuator functions. A non-limiting example of a reconfigurable analog I/O interface 230 may be found in the co-owned, co-pending application Ser. No. 12/750,341, which is herein incorporated by reference in its entirety. The reconfigurable I/O analog interface 230 is defined herein as a universal input/output (I/O) interface device.

In other embodiments, the universal I/O port 235 may be a reconfigurable digital I/O interface 240. The reconfigurable digital I/O port 240 provides for a multiple input and output functionality that allows multiple uses of various elements of the I/O interface in various modes of operation. For example, such modes may transmit digital data either in a discrete mode or transmit digital data in RS-485 mode.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

As a non-limiting example of its operation, the universal functionality module 200 may initially be connected to an astrological navigation effectuator 70' via the cable 210 and the generic pin set(s) or connectors set(s) 211/212. When connected to the cable 210, the generic pins 211/212 reflect a particular pattern of voltages and/or voltage signals that uniquely identify the effectuator 70' to which it is connected (i.e. the astrological navigation device). This pattern may be referred to herein as the "wired function." For instance, there may be seven (7) specific electric connector pins 211/212. Hence, there may be $2^7$, or 128, discrete effectuator personalities that may be recognize as the "wired function." However, there may be any number of connector pins 211/212 that may be used to identify the wired function. The balance of the generic pins 211/212 may be used for communications and control between the PLD and the effectuator 70'. In any event any or all of the generic pins 211/212 may be reconfigured for different roles in real time.

A function 250 executing in the RAM memory of the PLD 220 may include programming that controls, for example, the astrological navigation effectuator 70'. The function 250 may communicate commands and data from/to the astrological navigation effectuator 70', which may comprise an analog device (e.g. a positioning motor), a digital device (e.g. requesting imaging data) or both. The function 250 may also communicate commands and data from/to a higher level computer system (not shown) via the communication bus 90, although this is optional. A properly programmed universal functionality module 200 may operate an effectuator that is disconnected from communication bus 90 as a standalone device.

Further, because the universal functionality module 200 may be reprogrammed in the field, the function 250 that is loaded into the PLD 220 may be changed from time to time, in real time. For example, within the framework of a lunar lander, the universal functionality module 200 may have the operating system for the astrological navigational system loaded into the PLD 220 as function 250 while the lander is maneuvering in space. Once the lander has landed, the astrological navigation system is no longer needed and may be shut down. At that point the universal functionality module 200 may be physically removed from the equipment chassis 100 in the lander and reprogrammed with another functionality to run an appliance (e.g. a coffee maker) (not shown) or other load in the lunar base station, for example.

Furthermore, because the universal I/O port 235 may change the nature of any of the input/output pins 211/212 in real time, the universal functionality module 200 need only be physically inserted into the slot of the equipment chassis 100 that is associated with the coffee pot without the need for re-pinning or using an adapter. The universal functionality module 200 recognizes the new effectuator attached to the pin sets 211/212 and reconfigures the pin sets 211/212 into the requisite pin out configuration.

Also because the universal I/O port 235 may from time to time alternate the nature of the various pins in the generic pin sets 211/212 from input pins to output pins and from digital pins to analog pins repeatedly and in real time, more data may thus be communicated to and from the effectuator 70 utilizing less hardware, thereby taking up less space, and using less power.

Figure 3:
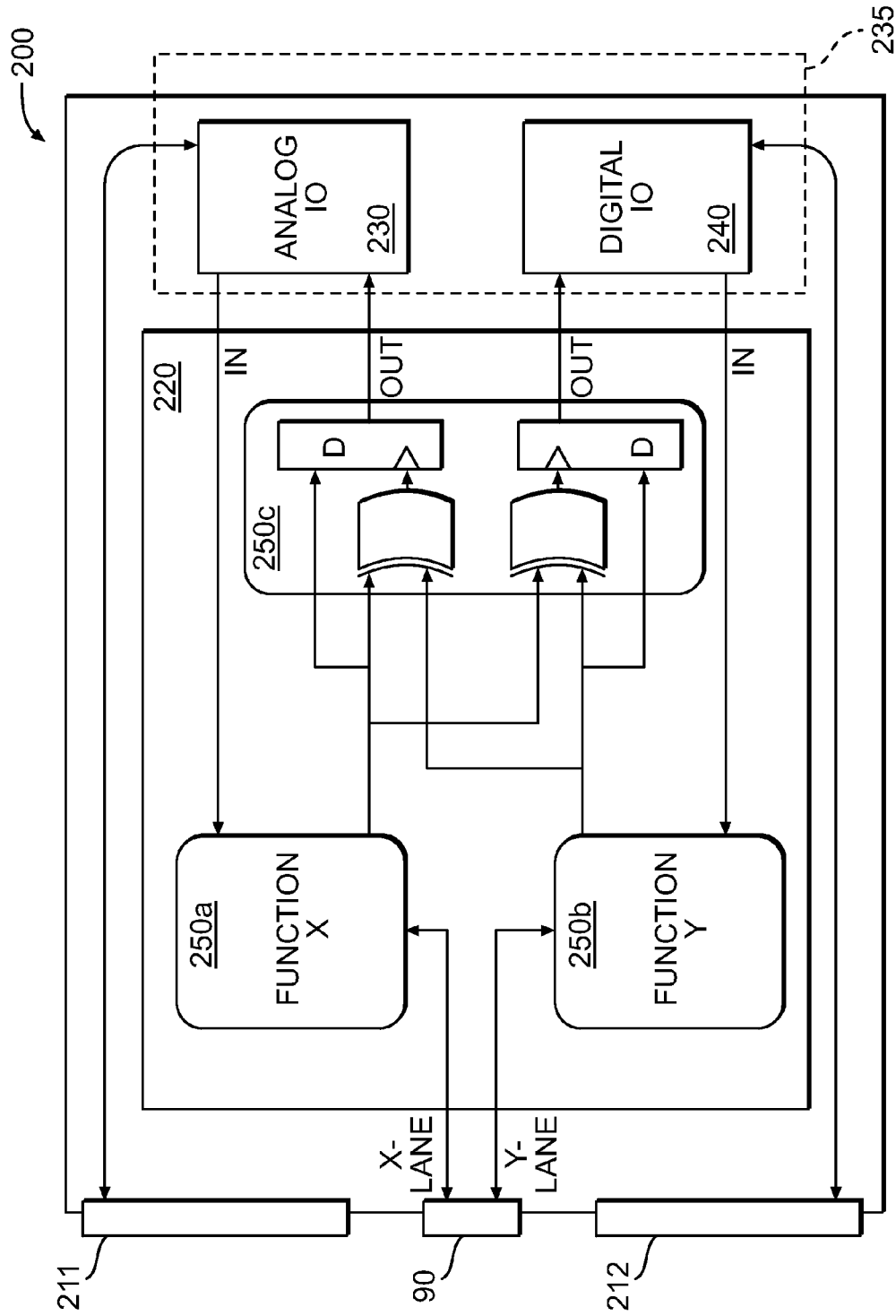
FIG. 3 is a functional block diagram of another exemplary embodiment of a Universal Functionality Module with a high integrity data bus fault detection personality.

FIG. 3 is an exemplary embodiment of the subject matter disclosed herein. In this embodiment a function 250 has been loaded into the PLD 220. This exemplary function 250 is a dual-lane, high integrity communications verification circuit comprising a first function (X) 250a on one lane, a second function (Y) 250b on a second lane and a data comparison logic circuit 250c that may comprise NOR gates or other logic structures. Those of ordinary skill in the art may recognize the exemplary function 250 as a "truth" circuit.

As non-limiting examples, functions (X) and (Y) may take on the functional personality of a virtual primary processor 250a and the functional personality of a virtual checking processor 250b, respectively. Each of the primary 250a and checking processor 250b may provide identical output signals in response to input signals from one or more sensors over lane (X) and lane (Y) of communications bus 90. These signals may be compared to one another by the virtual logic circuit 250c to determine if a data error occurred during processing by the primary and checking processors. A non-limiting example of a high integrity communications verification circuit suitable for use with the universal functionality module 200 disclosed herein is further described in co-owned, co-pending application Ser. No. 12/713,712, which is incorporated herein by reference in its entirety. However, in equivalent embodiments instead of virtual processors 250a and 250b, functions X and Y may be any of a myriad of functional personalities, as may be required.

In conjunction with operating an effectuator 70, the output of the function 250c may also control any settings or operating modes of the reconfigurable analog interface 230 and/or the reconfigurable digital I/O interface 240. For additional description concerning non-limiting, exemplary means for controlling the operating modes of an exemplary reconfigurable analog interface 230 and/or an exemplary reconfigurable digital interface 240, see U.S. patent application Ser. Nos. 12/750,341 and 12/768,448.

Figure 4:
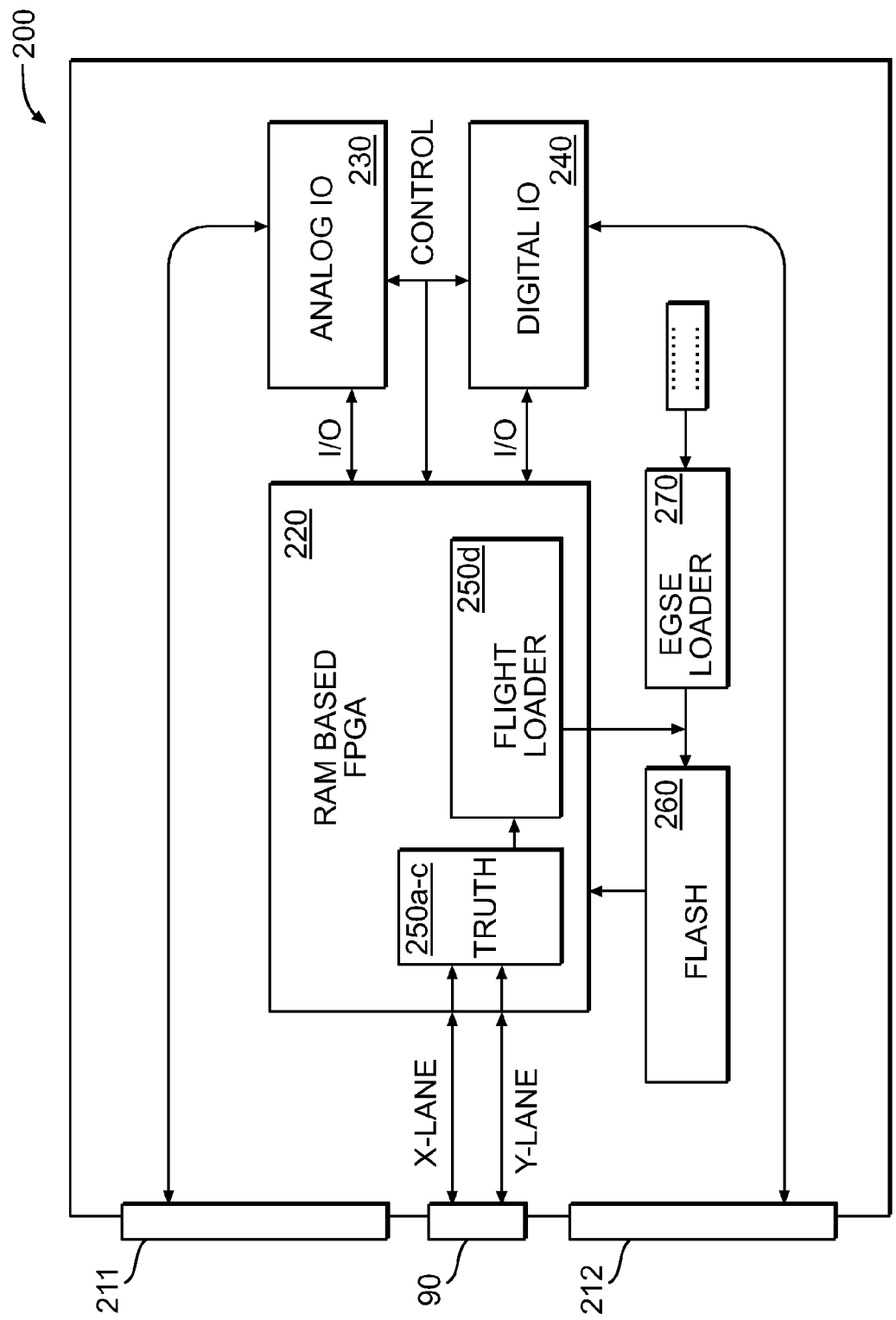
FIG. 4 is a functional block diagram of another exemplary embodiment of a Universal Functionality Module configured with an FPGA and loaded with a truth and with a flight loader personality.

FIG. 4 illustrates an embodiment wherein the function 250 includes a flight loader sub-function 250d as a functional personality. The universal functionality module 200 may also include a flash memory distinct from the PLD 220 and may include an electronic ground support equipment (EGSE) loader 270. The EGSE loader 270 is used to initially load one or more functional personalities into the flash memory 260 from an external device 271. This loading of software instructions may be referred to as the PLD 220 "taking on the personality" of the effectuator 70. In this process the universal functionality module 200 "becomes" the coffee maker controller instead of being the controller for the astrological navigation effectuator 70', to name just one example. Other embodiments could control any number of other peripherals, appliances, systems, sensors, devices or the like.

The flight loader 250d may itself be a functional personality that is uploaded into the PLD 220, or into a portion thereof, that in turn loads functional personalities into the flash memory 260 that may be received over communications bus 90 for future use. The flash memory 260 serves the function of a personality storage device where a multitude of functional personalities may be stored for future use, if called. When an appropriate indication is received by the flight loader 250d that a new personality or an updated personality is received, the flight data loader loads the new functional personality into the flash memory 260.

The flash memory 260 may load a new personality into PLD 220 under various circumstances. As non-limiting examples, the flash memory 260 may load a functional personality upon power up of the universal functionality module 200 or upon its insertion into a different slot in the equipment chassis 100.

The flash memory 260 may also upload a new functional personality if a command is received from a higher level computer instructing the universal functionality module 200 to load a new personality. This situation may occur, for example, when one universal functionality module operating a specific module malfunctions. In such a situation the higher level computer may instruct the universal functionality module 200 that is operating a different controlled device to load (in real time) the personality required to operate the effectuator of the failed universal functionality module. The universal functionality module 200 may then operate the other effectuator or both the other effectuator and the controlled device as may be required.

Figure 5:
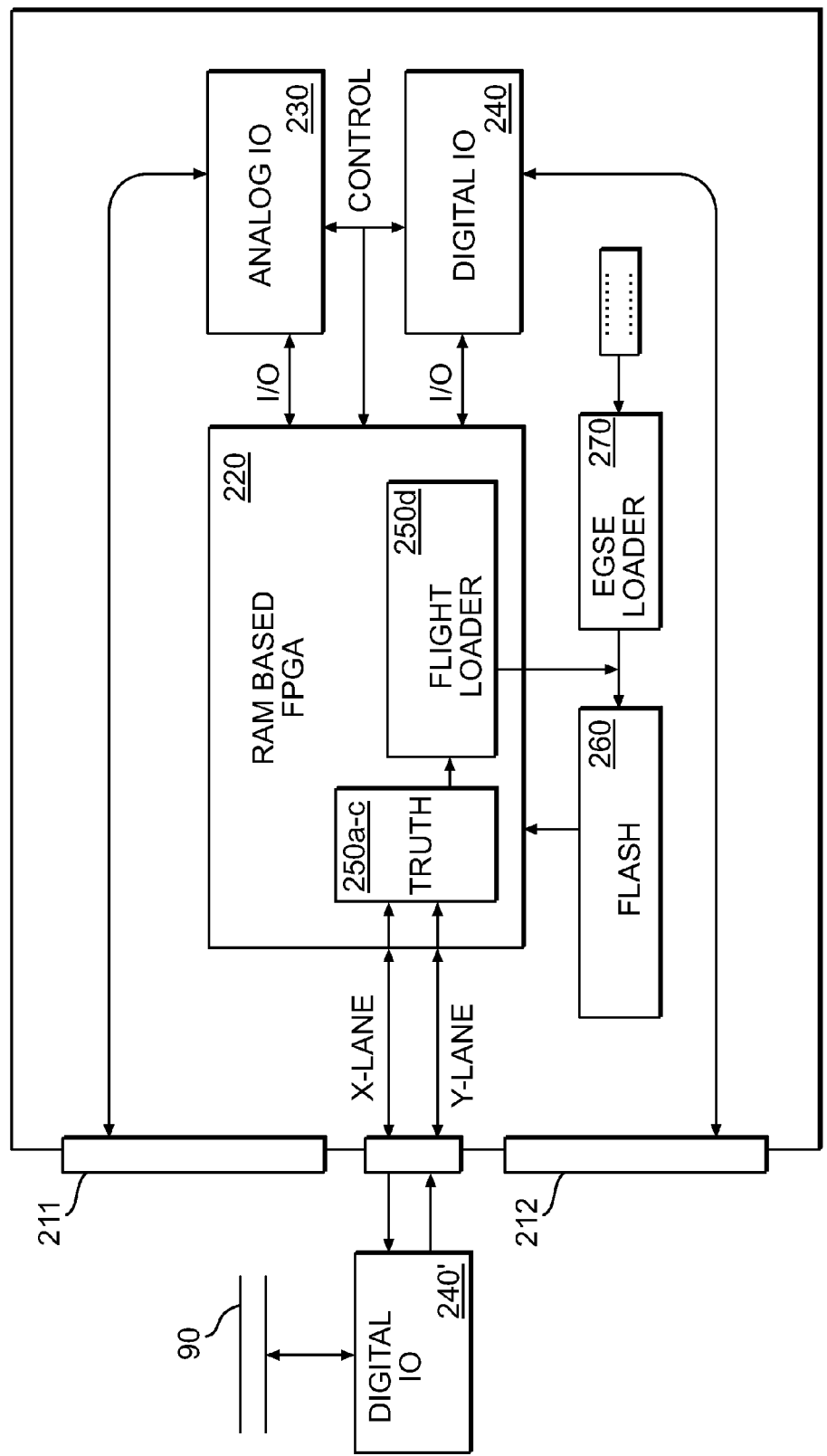
FIG. 5 is a functional block diagram of another exemplary embodiment of a Universal Functionality Module that is isolated from a data bus via a reconfigurable I/O interface.

FIG. 5 is a functional block diagram of an exemplary embodiment including an additional exemplary reconfigurable digital I/O interface 240' coupling the universal functionality module 200 to the communications bus 90. The use of the reconfigurable digital I/O interface 240' provides similar pin and signal flexibility thereby "decoupling" the universal functionality module 200 from the higher level computing device. This "decoupling" allows the universal functionality module 200 to communicate with any type(s) of computing devices via any communications bus 90 by the expedient of reconfiguring its I/O interface in real time.

Figure 6:
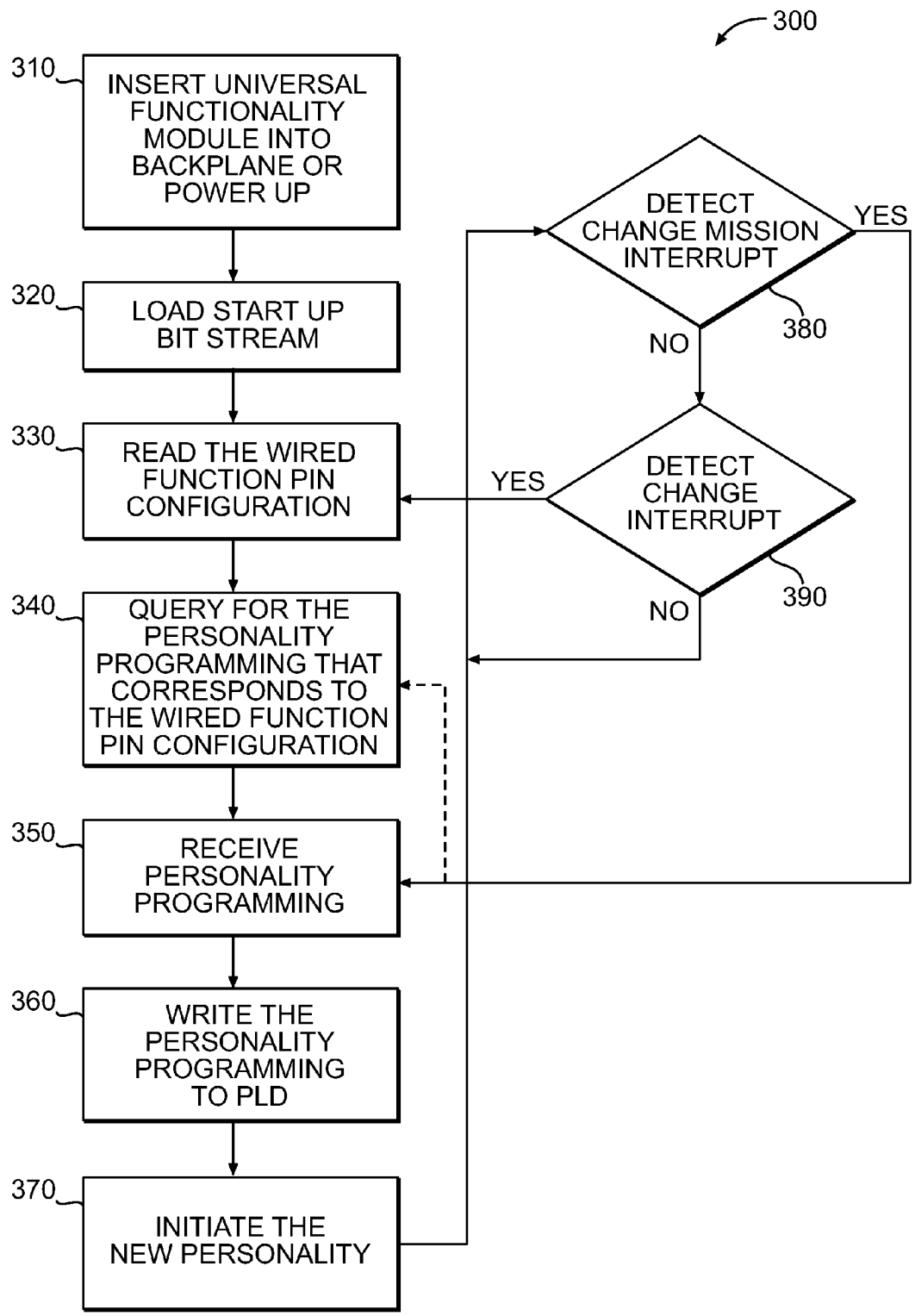
FIG. 6 is a logic flow diagram of an exemplary method of operation of an embodiment.

FIG. 6 is a logic flow chart of an exemplary embodiment of a method of operation 300 of a universal functionality module 200. The following method steps may be consolidated into fewer methods steps, broken down into sub-routines or smaller method steps and rearranged without departing from the scope of the disclosure herein.

At process 310, a universal functionality module 200 is connected to an effectuator 70 via cable 210 and is powered up. The universal functionality module 200 may optionally be placed in communication with the communications bus 90. Thus, the universal functionality module 200 can operate as a stand alone control device for an effectuator 70 or be apart of a larger network via buses 80/90.

At process 320, a start up bit stream may be automatically loaded from the flash memory 260 into the PLD 220. The start up bit stream is a boot code sufficient to allow the PLD 220 to recognize voltage values on the one or more electrical connectors 211/212 that identifies the effectuator 70 attached thereto. The start up bit stream may also include programming code sufficient to allow communications capability via communications bus 90 and to allow communications with flash memory 260.

At process 330, the PLD 220 detects and reads the voltage values that may exist on one of more of the generic electrical connectors 211/212. By reading the voltages, the booted PLD 220 can detect that an effectuator 70 is connected to the other end of the circuit and what type of effectuator it is, a coffee maker or a coolant system for example.

At process 340, the PLD 220 may query the flash memory 260 provide the personality programming that operates the effectuator identified at process 330. Further, the PLD 220 may query a higher level computer for the effectuator programming simultaneously or sequentially if the flash memory 260 indicates that it does not contain the requested programming. In other embodiments, the higher level computing device may query the PLD 220 to identify what functionality the PLD 220 may be running. Regardless as to which of the various methods were used to query for the proper functional identity, the functional identity programming is received at process 350 and written to the PLD 220 at process 360. At process 370 the new personality programming is initiated by the PLD 220 so as to begin control of the effectuator 70.

At decision point 380, it is determined if a "change mission" interrupt is received. A change mission interrupt occurs when a higher level computing device sends a message via communications bus 90 that tells the PLD 220 to change its personality programming ad control a different effectuator or control the current effectuator in a different manner. The message received interrupts the PLD 220 and either provides the personality programming (process 350) or instructs the PLD 220 to go locate the new personality programming (process 340). In either case the new personality programming is written to the PLD 220 and the method 300 proceeds from that point.

Those of ordinary skill in the art will recognized that the PLD 220 may be of sufficient size such that two personalities may be run by the same PLD 220. As such, the PLD 220 may be suitably partitioned to accommodate multiple personalities.

If no "change mission" interrupt is detected then the method 300 proceeds to the determination point 390 where it is determined if a "change" interrupt is received. A "change" interrupt may indicate the detection of a change in the effectuator 70 attached to electrical connectors 211/212. When a "change" interrupt is received, the method proceeds to process 330 as disclosed above. If a "change" interrupt is not detected then the system loops between decision points 380 and 390.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A universal functionality module comprising:
   a programmable logic device (PLD);
   a universal input/output (I/O) interface device in communication with the PLD; and
   a plurality of generic circuit board connector pins in operable communication with the universal I/O interface device, wherein the universal I/O interface device is configured to alternate the function of any subset of the plurality of the generic circuit board connector pins from time to time as either an input or an output of the PLD and as either an analog or a digital pin I/O pin.

2. The universal functionality module of claim 1, wherein the PLD is a field programmable gate array (FPGA).

3. The universal functionality module of claim 2, wherein the FPGA is a random access memory based FPGA.

4. The universal functionality module of claim 1, wherein the PLD is a flash based FPGA.

5. The universal functionality module of claim 1, wherein the universal I/O interface device comprises a reconfigurable multipurpose analog interface.

6. The universal functionality module of claim 5, wherein the universal I/O interface device comprises a reconfigurable multipurpose digital interface.

7. The universal functionality module of claim 1, wherein the universal I/O interface device comprises a reconfigurable multipurpose digital interface.

8. The universal functionality module of claim 7 wherein the reconfigurable multipurpose analog interface is configurable to alternately transmit one of a discrete data signal and a RS-485 data signal.

9. The universal functionality module of claim 1, further comprising:
   an electrical ground support equipment (EGSE) software loader;
   a flash memory, in communication with the EGSE loader; and
   a flight loader, in communication with the flash memory.

10. The universal functionality module of claim 1, further comprising a high integrity data bus error detection personality in communication with a communication bus and at least one of the reconfigurable digital interface, the reconfigurable analog interface and the flash memory.

11. A system configured to operate any effectuator device, comprising:
   a programmable logic device (PLD) configured to be reprogrammed from time to time in real time; and
   a means for universally interfacing the PLD with any effectuator device, the means for universally interfacing comprising a reprogrammable means for digital I/O interfacing.

12. The system of claim 11, wherein the means for universally interfacing the PLD with any effectuator device comprises a reprogrammable means for analog interfacing.

13. A system configured to operate any effectuator device, comprising:
   a programmable logic device (PLD) configured to be reprogrammed from time to time in real time; and
   a means for universally interfacing the PLD with any effectuator device, the means for universally interfacing comprising a reprogrammable means for analog I/O interfacing.

* * * * *